US010452588B2

(12) United States Patent
Ito et al.

(10) Patent No.: US 10,452,588 B2
(45) Date of Patent: Oct. 22, 2019

(54) SEMICONDUCTOR DEVICE

(71) Applicant: Toshiba Memory Corporation, Tokyo (JP)

(72) Inventors: Mikihiko Ito, Ota Tokyo (JP); Masaru Koyanagi, Ota Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 56 days.

(21) Appl. No.: 15/658,901

(22) Filed: Jul. 25, 2017

(65) Prior Publication Data
US 2018/0060265 A1 Mar. 1, 2018

(30) Foreign Application Priority Data

Aug. 23, 2016 (JP) .................................. 2016-162762

(51) Int. Cl.
| | |
|---|---|
| *G11C 5/06* | (2006.01) |
| *G06F 13/40* | (2006.01) |
| *G06F 13/16* | (2006.01) |
| *G11C 7/22* | (2006.01) |
| *G11C 5/02* | (2006.01) |
| *G11C 7/10* | (2006.01) |
| *G11C 16/26* | (2006.01) |

(52) U.S. Cl.
CPC ...... *G06F 13/4068* (2013.01); *G06F 13/1668* (2013.01); *G11C 5/025* (2013.01); *G11C 5/063* (2013.01); *G11C 7/10* (2013.01); *G11C 7/22* (2013.01); *G11C 16/26* (2013.01)

(58) Field of Classification Search
None
See application file for complete search history.

(56) References Cited

U.S. PATENT DOCUMENTS 5,621,695 A * 4/1997 Tran .................... G11C 7/1039
365/189.02
6,791,193 B2 9/2004 Watanabe et al.
(Continued)

FOREIGN PATENT DOCUMENTS

| JP | 2003264240 A | 9/2003 |
|---|---|---|
| JP | 3825252 B2 | 9/2006 |

(Continued)

*Primary Examiner* — Vibol Tan
(74) *Attorney, Agent, or Firm* — Kim & Stewart LLP

(57) ABSTRACT

A semiconductor device includes first input/output circuits for a first channel, first input/output pads corresponding to the first input/output circuits, respectively, wherein the first input/output pads are aligned along and extends in a first direction, second input/output circuits for the first channel, second input/output pads corresponding to the second input/output circuits, respectively, wherein the second input/output pads are aligned along and extends in a second direction, and an input circuit between the first input/output pads and the second input/output pads, and connected to a memory to which the input circuit inputs data from the first input/output circuits and the second input/output circuits. The input circuit is positioned such that a first line extending perpendicular to the first direction from one of the first input/output pads and a second line extending perpendicular to the second direction from one of the second input/output pads intersect a portion of the input circuit.

10 Claims, 11 Drawing Sheets

(56) References Cited

U.S. PATENT DOCUMENTS

| | | | |
|---|---|---|---|
| 6,847,120 B2 | 1/2005 | Ohno | |
| 7,738,311 B2* | 6/2010 | Youn | G11C 5/025 |
| | | | 365/185.11 |
| 7,904,639 B2 | 3/2011 | Kim et al. | |
| 9,432,298 B1* | 8/2016 | Smith | H04L 49/9057 |
| 9,471,484 B2 | 10/2016 | Oh et al. | |
| 9,601,171 B2* | 3/2017 | Kim | G11C 7/222 |
| 9,691,782 B1* | 6/2017 | Hwang | H01L 27/11565 |
| 9,748,956 B2* | 8/2017 | Lee | H03K 19/01754 |
| 9,811,493 B2* | 11/2017 | Kojima | G06F 13/4027 |
| 10,032,523 B2* | 7/2018 | Son | G11C 29/846 |
| 10,078,110 B2* | 9/2018 | Yun | G01R 31/025 |
| 2008/0112251 A1 | 5/2008 | Youn et al. | |
| 2016/0204782 A1* | 7/2016 | Lee | H03K 19/01754 |
| | | | 365/189.17 |

FOREIGN PATENT DOCUMENTS

| | | |
|---|---|---|
| JP | 4731336 B2 | 7/2011 |
| TW | 200849276 A | 12/2008 |
| TW | 201428748 A | 7/2014 |

\* cited by examiner

SEMICONDUCTOR DEVICE

CROSS-REFERENCE TO RELATED APPLICATION

This application is based upon and claims the benefit of priority from Japanese Patent Application No. 2016-162762, filed Aug. 23, 2016, the entire contents of which are incorporated herein by reference.

FIELD

Embodiments described herein relate generally to a semiconductor device.

BACKGROUND

A semiconductor device in which core chips are stacked using through-silicon via (TSV) on an interface chip provided on a semiconductor substrate, is known.

DETAILED DESCRIPTION

Embodiments provide a semiconductor device capable of improving operational reliability.

In general, according to one embodiment, a semiconductor device includes a plurality of first input/output circuits for a first channel, a plurality of first input/output pads corresponding to the plurality of first input/output circuits, respectively, wherein the first input/output pads are aligned along and extends in a first direction, a plurality of second input/output circuits for the first channel, a plurality of second input/output pads corresponding to the plurality of second input/output circuits, respectively, wherein the second input/output pads are aligned along and extends in a second direction, and an input circuit between the first input/output pads and the second input/output pads, and connected to a memory to which the input circuit performs input of data from the plurality of first input/output circuits and the plurality of second input/output circuits. The input circuit is positioned such that a first line extending perpendicular to the first direction from one of the first input/output pads and a second line extending perpendicular to the second direction from one of the second input/output pads intersect a portion of the input circuit.

Embodiments will be described below with reference to the drawings.

1. First Embodiment

A memory system according to a first embodiment will be described. In the following description, as an example, a memory system will be described which includes a NAND flash memory in which memory cells are two-dimensionally arranged on a semiconductor substrate. A high-speed memory system employing a DDR mode is described in the embodiment, but another memory system may be used. The memory system according to the embodiment may be a general-purpose memory system.

1.1 Configuration

In the following description, as an example, a memory system will be described which includes a NAND flash memory in which memory cells are two-dimensionally arranged on a semiconductor substrate.

1.1.1 Overall Configuration of Memory System

Figure 1:
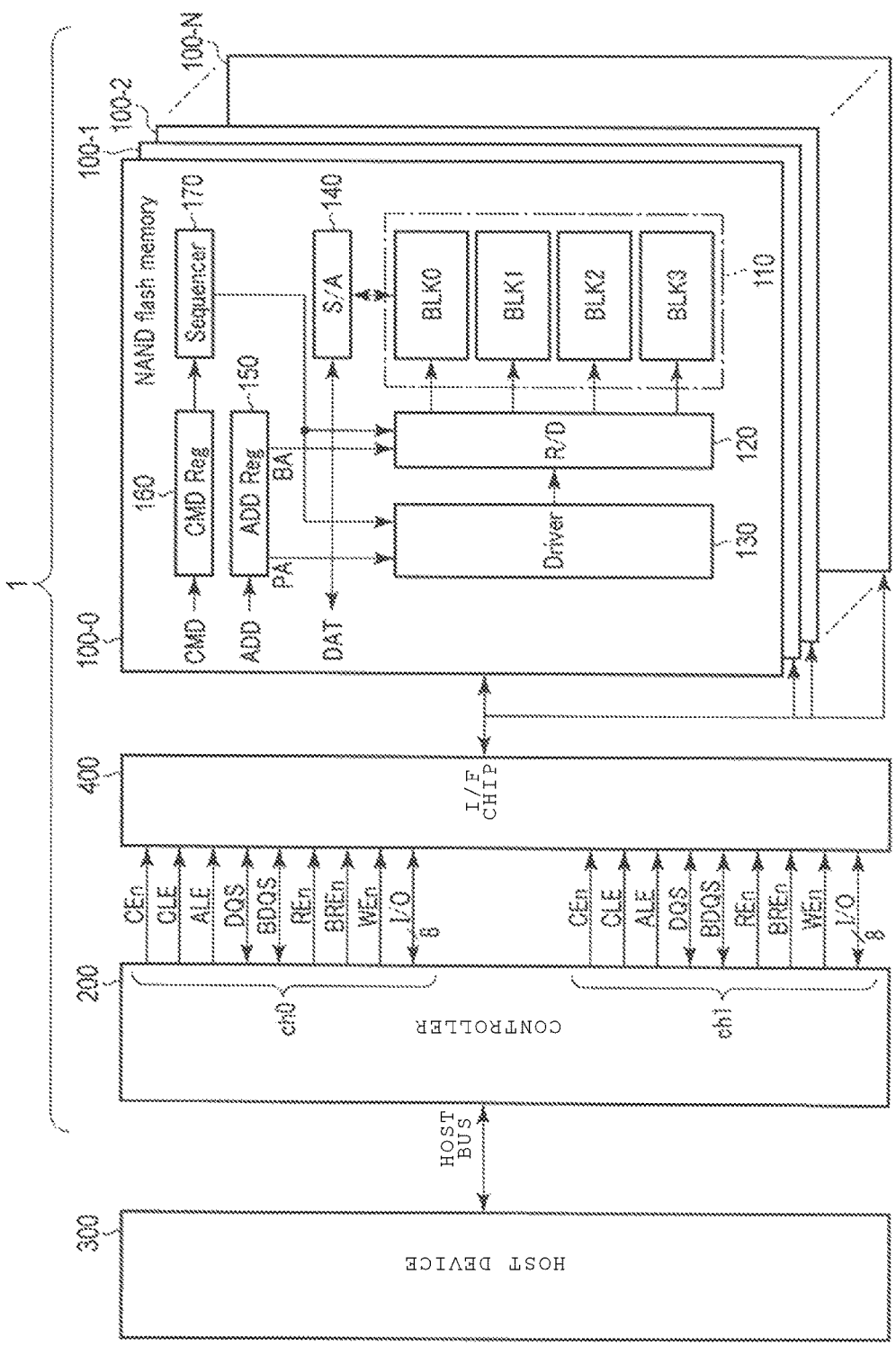
FIG. 1 is a block diagram of a memory system.

First, a schematic overall configuration of the memory system according to this embodiment will be described with reference to FIG. 1. FIG. 1 is a block diagram of the memory system according to this embodiment.

As illustrated in FIG. 1, a memory system 1 includes a plurality of NAND flash memories 100-0 to 100-N, an interface (I/F) chip 400, and a controller 200. In the embodiment, when there is no need to discriminate between the NAND flash memories 100-0 to 100-N, these are collectively referred as "NAND flash memory 100". The same applies to other components.

The NAND flash memory 100 includes a plurality of memory cells and stores data in a nonvolatile manner. In the embodiment, the NAND flash memory 100 has two channels (channel 0 (ch0) and channel 1 (ch1)). The controller 200 is connected to the NAND flash memory 100 by a NAND bus via the I/F chip 400 for each channel and is connected to a host device 300 by a host bus. Then, the controller 200 controls the NAND flash memory 100 for each channel via the I/F chip 400. In response to a command received from the host device 300, the controller 200 accesses the NAND flash memory 100 for each channel via the I/F chip 400. The host device 300 is, for example, a digital camera or a personal computer, and the host bus is, for example, a bus according to an SD™ interface.

Signals according to the NAND interface are transmitted and received through the NAND bus. In the embodiment, as illustrated in FIG. 1, the controller 200 is connected to the I/F chip 400 by the NAND interface of two channels. Although the case where the NAND interface is provided for each channel is illustrated herein, the same NAND interface may be provided using identification information of the channel or the like.

Specific examples of these signals include a chip enable signal CEn, an address latch enable signal ALE, a command latch enable signal CLE, a write enable signal WEn, a read enable signal REn, an input/output signal I/O, and a data strobe signal DQS.

The signal CEn enables the NAND flash memory 100, and is asserted at a low level. The signals CLE and ALE are used to notify the NAND flash memory 100 of the fact that the input signals I/O to the NAND flash memory 100 are a command and an address, respectively. The signal WEn is used to import the command or the address at transition timing from the low level to a high level. The signal REn is also asserted at a low level and is used to read the output signal I/O from the NAND flash memory 100. The signal BREn is a complementary signal of the signal REn, and is used to read the output signal I/O from the NAND flash memory 100.

The input/output signal I/O is, for example, an 8-bit signal. The input/output signal I/O contains data transmitted and received between the NAND flash memory 100 and the controller 200, and includes a command, an address, write data, and read data, for example.

The signal DQS and a complementary signal BDQS of the signal DQS are output from a transmitting side together with the signal I/O. A data receiving side receives the transmitted signals DQS and BDQS, thereby adjusting data importing timing.

1.1.2 Configuration of NAND Flash Memory 100

A configuration of the NAND flash memory 100 will be described below. As illustrated in FIG. 1, the NAND flash memory 100 includes a memory cell array 110, a row decoder 120, a driver circuit 130, a sense amplifier 140, an address register 150, a command register 160, and a sequencer 170.

The memory cell array 110 includes, for example, four blocks BLK (BLK0 to BLK3) which are an assembly of a plurality of nonvolatile memory cells arranged in rows and columns. The memory cell array 110 stores data supplied from the controller 200.

The row decoder 120 selects one of the blocks BLK0 to BLK3, and further selects a row in the selected block BLK.

The driver circuit 130 supplies a voltage to the selected block BLK via the row decoder 120.

The sense amplifier 140 senses the data read from the memory cell array 110 and performs an arithmetic operation at the time of data reading. Then, the sense amplifier 140 outputs data DAT to the controller 200. The sense amplifier 140 transfers write data DAT, which is received from the controller 200, to the memory cell array 110 at the time of data writing.

The address register 150 retains an address ADD received from the controller 200. The command register 160 retains a command CMD received from the controller 200.

The sequencer 170 controls the entire operation of the NAND flash memory 100 based on the command CMD retained in the command register 160.

The memory cell array 110 may have a structure in which memory cell transistors are three-dimensionally stacked on the semiconductor substrate. Such a structure is disclosed, for example, in U.S. patent application Ser. No. 12/407,403 filed on Mar. 19, 2009, with a title of "Three dimensional stacked nonvolatile semiconductor memory," U.S. patent application Ser. No. 12/406,524 filed on Mar. 18, 2009 with a title of "Three dimensional stacked nonvolatile semiconductor memory," U.S. patent application Ser. No. 12/679,991 filed on Mar. 25, 2010 with a title of "Non-volatile semiconductor storage device and method of manufacturing the same," and U.S. patent application Ser. No. 12/532,030 filed Mar. 23, 2009 with a title of "Semiconductor memory and method for manufacturing same." The entire contents of all of these patent applications are incorporated herein by reference.

1.1.3 Configuration of I/F Chip 400

Figure 2:
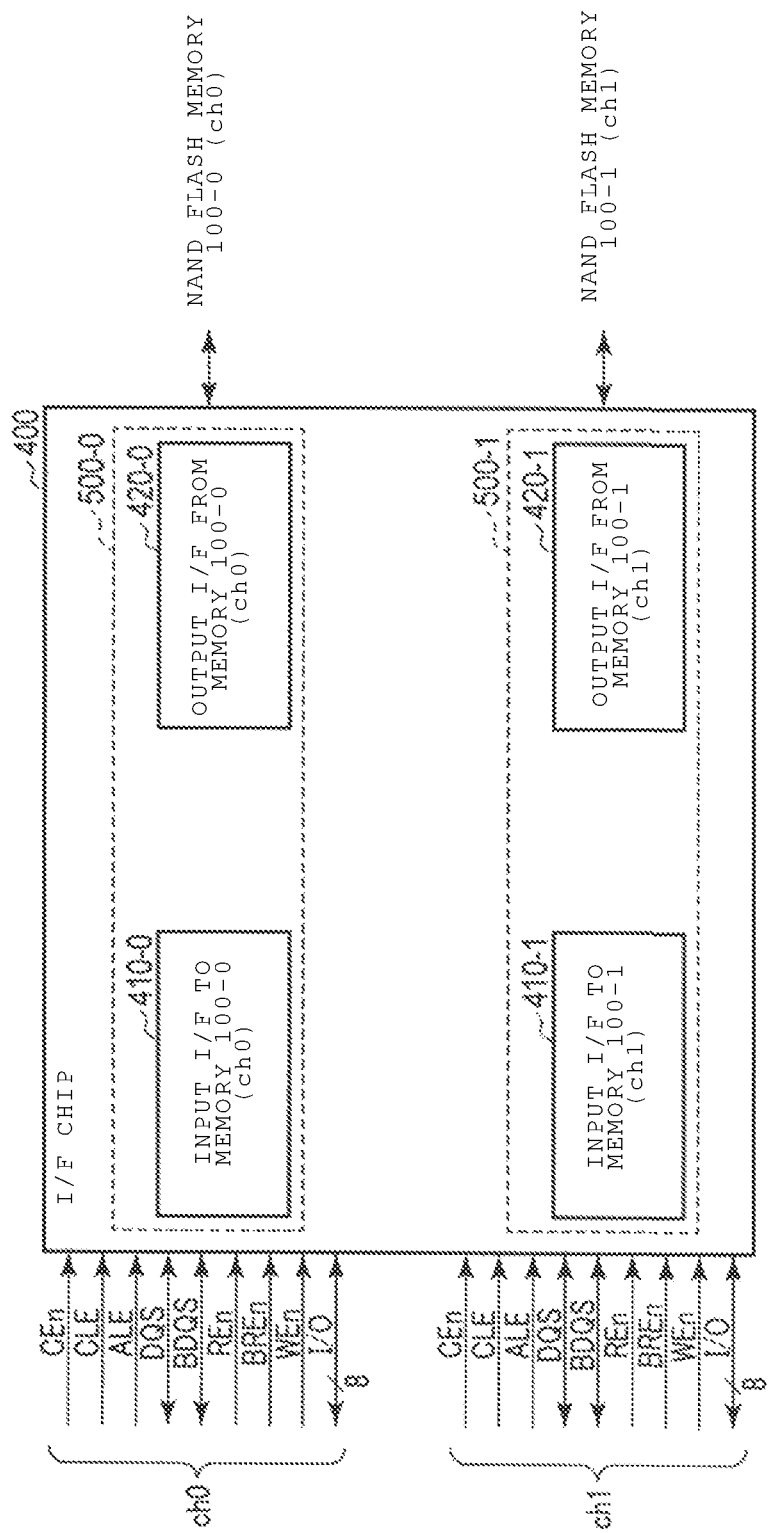
FIG. 2 is a diagram illustrating a configuration of an interface (I/F) chip.

FIG. 2 is a diagram illustrating a configuration of the I/F chip 400 according to the embodiment.

The I/F chip 400 includes an I/F circuit 500 for each channel. In the embodiment, each of the plurality of NAND flash memories 100-0 to 100-N is connected to either channel 0 (ch0) or channel 1 (ch1).

Therefore, it is possible to simultaneously access to (N+1) NAND flash memories 100-0 to 100-N by two channels (channel 0 (ch0) and channel 1 (ch1)).

The I/F circuit 500-0 for the channel 0 (ch0) includes an input I/F 410-0 and an output I/F 420-0, the signal I/O or the like being input to the NAND flash memory 100 for the channel 0 (ch0) from the controller 200 through the I/F 410-0, and the signal I/O or the like being output to the controller 200 from the NAND flash memory 100 for the channel 0 (ch0) through the output I/F 420-0.

The I/F circuit 500-1 for the channel 1 (ch1) includes an input I/F 410-1 and an output I/F 420-1, the signal I/O or the like being input to the NAND flash memory 100 for the channel 1 (ch1) from the controller 200 through the I/F 410-1, and the signal I/O or the like being output to the controller 200 from the NAND flash memory 100 for the channel 1 (ch1) through the output I/F 420-1.

The input I/F 410-0 is an interface used to connect the signals (CEn, ALE, CLE, WEn, REn, BREn, I/O, DQS, and BDQS) input to the channel 0 (ch0) from the controller 200 to the NAND flash memory 100 for the corresponding channel 0 (ch0).

The input I/F 410-1 is an interface used to connect the signals (CEn, ALE, CLE, WEn, REn, BREn, I/O, DQS, and BDQS) input to the channel 1 (ch1) from the controller 200 to the NAND flash memory 100 for the corresponding channel 1 (ch1).

The output I/F 420-0 is an interface used to connect the data (signal I/O) output from the NAND flash memory 100 for the channel 0 (ch0) to the channel 0 (ch0) of the controller 200.

The output I/F 420-1 is an interface used to connect the data (signal I/O) output from the NAND flash memory 100 for the channel 1 (ch1) to the channel 1 (ch1) of the controller 200.

1.1.4 Layout Configuration of Pads Pa on I/F Chip 400

Figure 3:
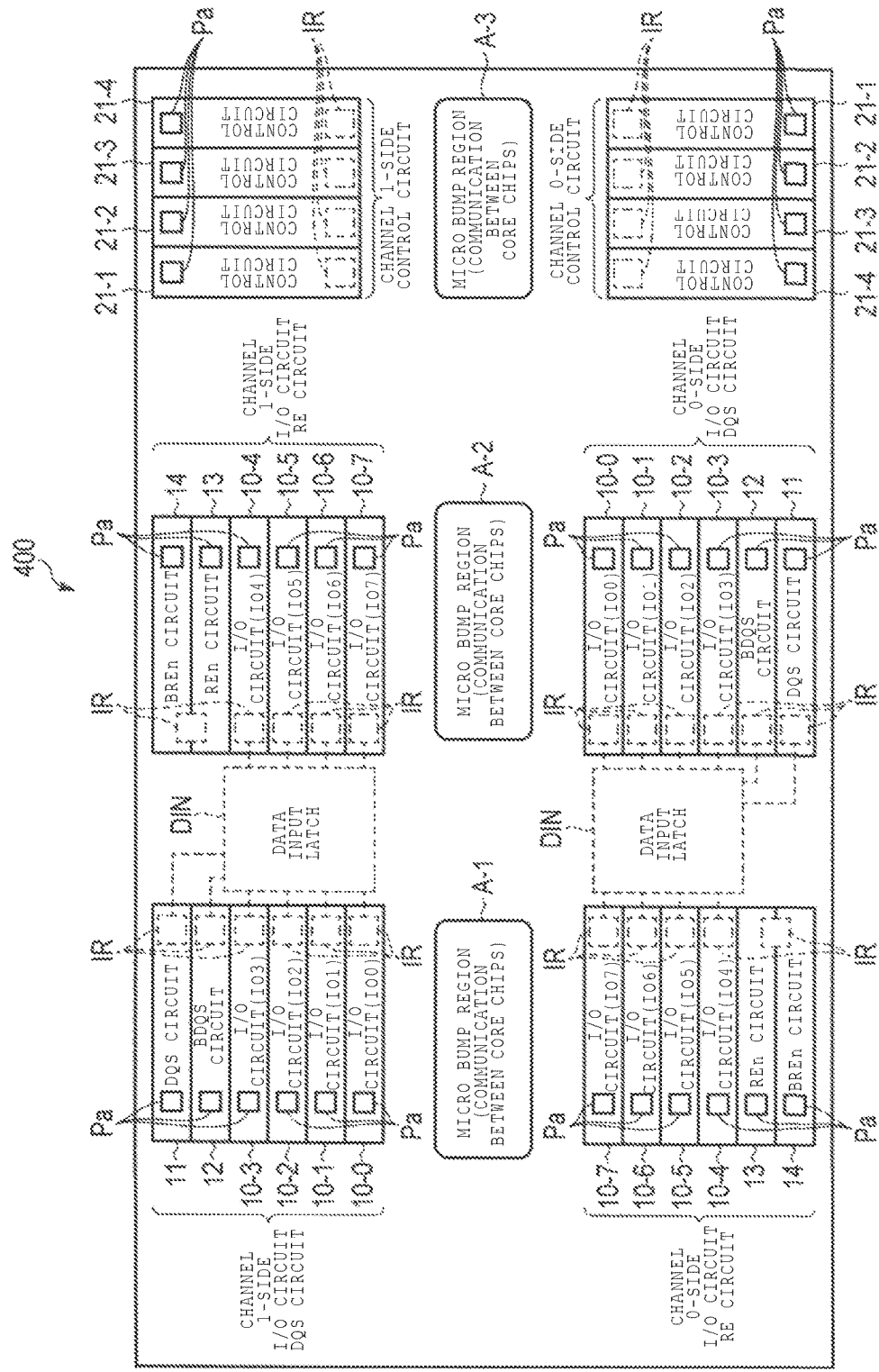
FIG. 3 is a diagram illustrating a layout configuration of pads on the I/F chip according to a first embodiment.

FIG. 3 is a diagram illustrating a layout configuration of pads Pa on the I/F chip 400 having a two-channel configuration according to the first embodiment.

A channel 0 (ch0)-side configuration will be described. As illustrated in FIG. 3, each of I/O circuits 10-0 to 10-7 on the channel 0 (ch0) side includes a pad Pa that is used to input/output a signal I/O to and from the channel 0 (ch0) of the controller 200, and an input receiver IR that receives the signal input via the pad Pa from the channel 0 of the controller 200.

Each of a DQS circuit 11, a BDQS circuit 12, an REn circuit 13, and a BREn circuit 14 includes a pad Pa that is used to input/output a signal to and from the channel 0 (ch0) of the controller 200. Each of the DQS circuit 11 and the BDQS circuit 12 includes independently an input receiver IR. The REn circuit 13 and the BREn circuit 14 share an input receiver IR.

Each of control circuits 21-1 to 21-4 includes a pad Pa that is used to input/output a signal to and from the channel 0 of the controller 200 and an input receiver IR that receives the signal input via the pad Pa from the channel 0 of the controller 200. The signals (CEn, ALE, CLE, and WEn) other than the signals (I/O, DQS, BDQS, REn, and BREn) are input/output to and from the control circuits 21-1 to 21-4.

A micro bump MBP is formed on the pad Pa, and the I/F chip 400 and the channel 0 (ch0) of the controller 200 are electrically connected to each other via the micro bump MBP. That is, signal communication between the corresponding circuit (e.g., I/O circuit 10, DQS circuit 11, BDQS circuit 12, REn circuit 13 and BREn circuit 14, or control circuit 21) of the I/F chip 400 and the controller 200 is performed via the pad Pa.

In addition, communication between the corresponding circuit of the I/F chip 400 and the NAND flash memory 100 selected by address selection is performed via corresponding pads (not illustrated) of micro bump regions A-1 to A-3 and the micro bumps MBPs. A connection relation between the I/F chip 400, the controller 200, and the NAND flash memory 100 will be described below with reference to FIG. 6.

The pads Pa of the I/O circuits 10-0 to 10-3, the BDQS circuit 12, and the DQS circuit 11 on the channel 0 (ch0) side are arranged in one line from the inner side to the outer side of the I/F chip 400. Similarly, the pads Pa of the I/O circuits 10-7 to 10-4, the REn circuit 13, and the BREn circuit 14 on the channel 0 (ch0) side are arranged in one line from the inner side to the outer side of the I/F chip 400. Wiring distances between the input receivers IR and the corresponding pads Pa of the I/O circuits 10-0 to 10-7 are respectively constant.

Compared to the pads Pa of the DQS circuit 11 and the BDQS circuit 12, the pad Pa of each of the I/O circuits 10-0 to 10-3 is arranged to the inner side of the I/F chip 400. The pad Pa of each of the I/O circuits 10-4 to 10-7 is arranged inner side of the I/F chip 400, compared to the pads Pa of the REn circuit 13 and the BREn circuit 14.

A data input latch DIN for the channel 0 (ch0) is connected to each of the input receivers IRs of the I/O circuits 10-0 to 10-7, the DQS circuit 11, and the BDQS circuit 12 through wiring.

The data input latch DIN is arranged between a row of the pads Pa of the I/O circuits 10-0 to 10-3, the DQS circuit 11, and the BDQS circuit 12 and a row of the pads Pa of the I/O circuits 10-4 to 10-7, the REn circuit 13, and the BREn circuit 14. With such a layout of the data input latch DIN, it is possible to make the wiring length between each of the input receivers IRs of the I/O circuits 10-0 to 10-7 and the data input latch DIN to be substantially uniform.

Each of the control circuits 21-1 to 21-4 on the channel 0 (ch0) side includes the input receiver IR and the pad Pa. The pads Pa of the control circuits 21-1 to 21-4 are arranged in a row. The row of the pads Pa of the control circuits 21-1 to 21-4 is orthogonal to the row of the pads Pa of the I/O circuits 10-0 to 10-3, the DQS circuit 11, and the BDQS circuit 12 and the row of the pads Pa of the I/O circuits 10-4 to 10-7, the REn circuit 13, and the BREn circuit 14.

Next, a channel 1 (ch1)-side configuration will be described. The channel 1 (ch1)-side configuration is similar to the channel 0 (ch0)-side configuration except as follows. That is, the I/O circuits 10-0 to 10-7, the DQS circuit 11, BDQS circuit 12, the REn circuit 13, and the BREn circuit 14 on the channel 1 (ch1) side are arranged to be point symmetric with respect to the center between the circuits of the channel 0 (ch0) (e.g., the I/O circuits 10-0 to 10-7, the DQS circuit 11, the BDQS circuit 12, the REn circuit 13, and the BREn circuit 14) and the circuits on the channel 1 (ch1) (e.g., the I/O circuits 10-0 to 10-7, the DQS circuit 11, the BDQS circuit 12, the REn circuit 13, and the BREn circuit 14).

In addition, the control circuits 21-1 to 21-4 on the channel 1 (ch1) side are arranged to be point symmetric with respect to the center between the control circuits 21-1 to 21-4 of the channel 0 (ch0) and the control circuits 21-1 to 21-4 of the channel 1 (ch1).

The micro bump region A-1 is formed between a region where the I/O circuits 10-4 to 10-7, the REn circuit 13, and the BREn circuit 14 of the channel 0 (ch0) are formed and a region where the I/O circuits 10-0 to 10-3, the DQS circuit 11, and the BDQS circuit 12 of the channel 1 (ch1) are formed.

The micro bump region A-2 is formed between a region where the I/O circuits 10-0 to 10-3, the DQS circuit 11, and the BDQS circuit 12 of the channel 0 (ch0) are formed and a region where the I/O circuits 10-4 to 10-7, the REn circuit 13, and the BREn circuit 14 of the channel 1 (ch1) are formed.

The micro bump region A-3 is formed between a region where the control circuits 21-1 to 21-4 of the channel 0 (ch0) are formed and a region where the control circuits 21-1 to 21-4 of the channel 1 (ch1) are formed. In addition, there is a region where a voltage generating circuit (not shown) is formed. Pads (not illustrated) are formed in the micro bump regions A-1, A-2, and A-3, and the micro bumps MBPs are formed on these pads, thereby being used for connection with a core chip CC-8.

1.1.5 Circuit Configuration for Data Input/Output of I/F Chip 400

Figure 4:
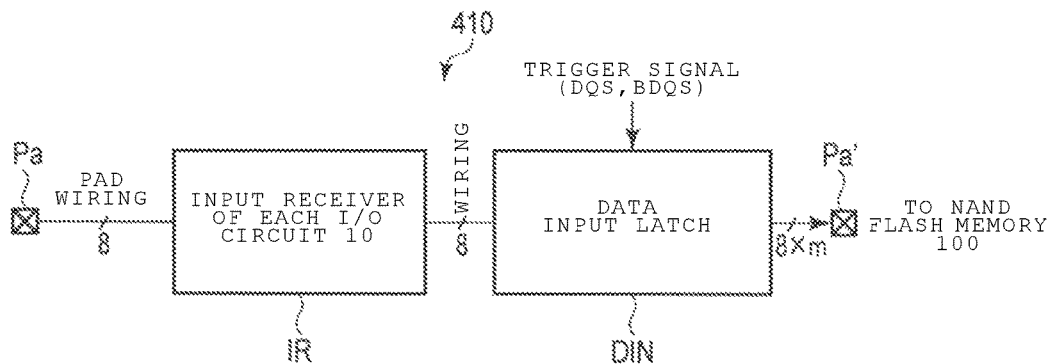
FIG. 4 is a diagram illustrating wiring for data input in the I/F chip.

FIG. 4 is a diagram illustrating the wiring between the input receiver IR of each I/O circuit 10 on a data input side of the I/F chip 400 according to the embodiment and the data input latch DIN. The input receiver IR and the data input latch DIN indicate the wiring relation for each channel.

As illustrated in FIG. 4, the pad Pa of each of the I/O circuits 10-0 to 10-7 is connected to the input receiver IR of each of the I/O circuits 10-0 to 10-7 by pad wiring.

The input receivers IRs (for example, the input receivers IRs of the I/O circuits 10-0 to 10-7 on the channel 0 (ch0) side in FIG. 3) of the I/O circuits 10-0 to 10-7 are connected to the data input latch DIN (for example, the data input latch DIN on the channel 0 (ch0) side in FIG. 3) by wiring. In the I/F chip 400, the distance between the pad Pa of each of the I/O circuits 10-0 to 10-7 and the input receiver IR corresponding to the pad Pa is constant. In the embodiment, the wiring length between the input receiver IR of each of the I/O circuits 10-0 to 10-7 and the data input latch DIN is designed to be shorter than that in the I/F chip 400 according to the related art.

The data input latch DIN receives, as a trigger signal, the signal DQS sent from the controller 200 and input to the input receiver IR via the pad Pa of the DQS circuit 11 and the signal BDQS input to the input receiver IR via the pad Pa of the BDQS circuit 12. The data input latch DIN is connected to a pad Pa' of the corresponding micro bump MBP of the micro bump regions A-1 and A-2, and latches the signal I/O (8 bits) received by the input receiver IR of each of the I/O circuits 10-0 to 10-7, based on the input trigger signal (the signal DQS and the signal BDQS).

The data latched by the data input latch DIN is output to the NAND flash memory 100 selected by the address selection via the corresponding pad Pa' and the micro bump MBP of the micro bump regions A-1 and A-2. For example, data is output to the NAND flash memory 100 in (8×m) bits (where m may be one or more).

Figure 5:
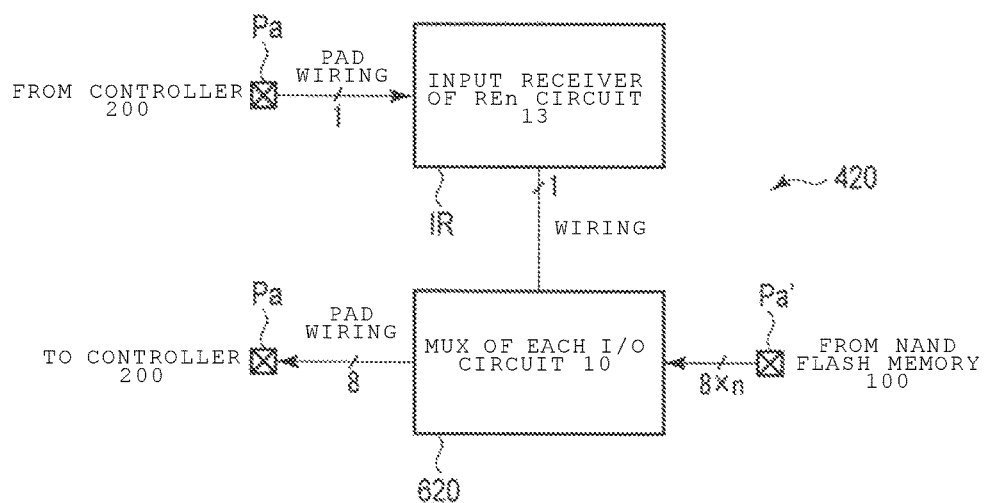
FIG. 5 is a diagram illustrating a wiring for data output in the I/F chip.

FIG. 5 is a diagram illustrating wiring between the input receiver IR of the REn circuit 13 on a data output side of the I/F chip 400 according to the embodiment and an MUX 620 of each I/O circuit 10. Each channel has one input receiver IR and eight MUX's 620, and eight I/O pads.

As illustrated in FIG. 5, the pad Pa of the REn circuit 13 and the input receiver IR of the REn circuit 13 are connected to each other by pad wiring. In addition, the input receiver IR of the REn circuit 13 and the MUX 620 of each I/O circuit 10 are connected to each other by the internal wiring of the I/F chip 400.

The MUX 620 of each I/O circuit 10 is connected to a pad Pa' of the corresponding micro bump MBP of the micro bump regions A-1 and A-2. In addition, the MUX 620 of each I/O circuit 10 is connected to the pad Pa of each I/O circuit 10 by pad wiring (8 bits). The MUX 620 selects the corresponding read data sent from the NAND flash memory 100 and stored in a buffer based on the signal REn from the input receiver IR of the REn circuit 13. For example, data is output from the NAND flash memory 100 in (8×n) bits (where n is one or more).

Based on the signal REn from the input receiver IR of the REn circuit 13, signals DQS and BDQS are generated in the MUX circuits of the DQS circuit 11 and the BDQS circuit 12, respectively. The generated signals DQS and BDQS are output to the channel 0 (ch0) of the controller 200 via the pads Pa of the DQS circuit 11 and the BDQS circuit 12.

The read data selected by the MUX 620 of the I/O circuits 10-0 to 10-7 is output to the controller 200, via an output driver driven by a pre-driver, at a double data rate via the pad Pa of each I/O circuit 10, using the falling edge of the signals DQS and BDQS generated in the I/F chip 400.

In the embodiment, a wiring length between an input receiver IR of the REn circuit 13 and the MUX 620 of the I/O circuits 10-0 to 10-7 is designed to be shorter than that in the I/F chip 400 according to the related art.

In the embodiment, although the MUX 620 of the I/O circuits 10-0 to 10-7 is described, other components (for example, a pre-driver) of the output circuits may be used.

1.1.6 Mounting of I/F Chip 400 and NAND Flash Memory 100

Figure 6:
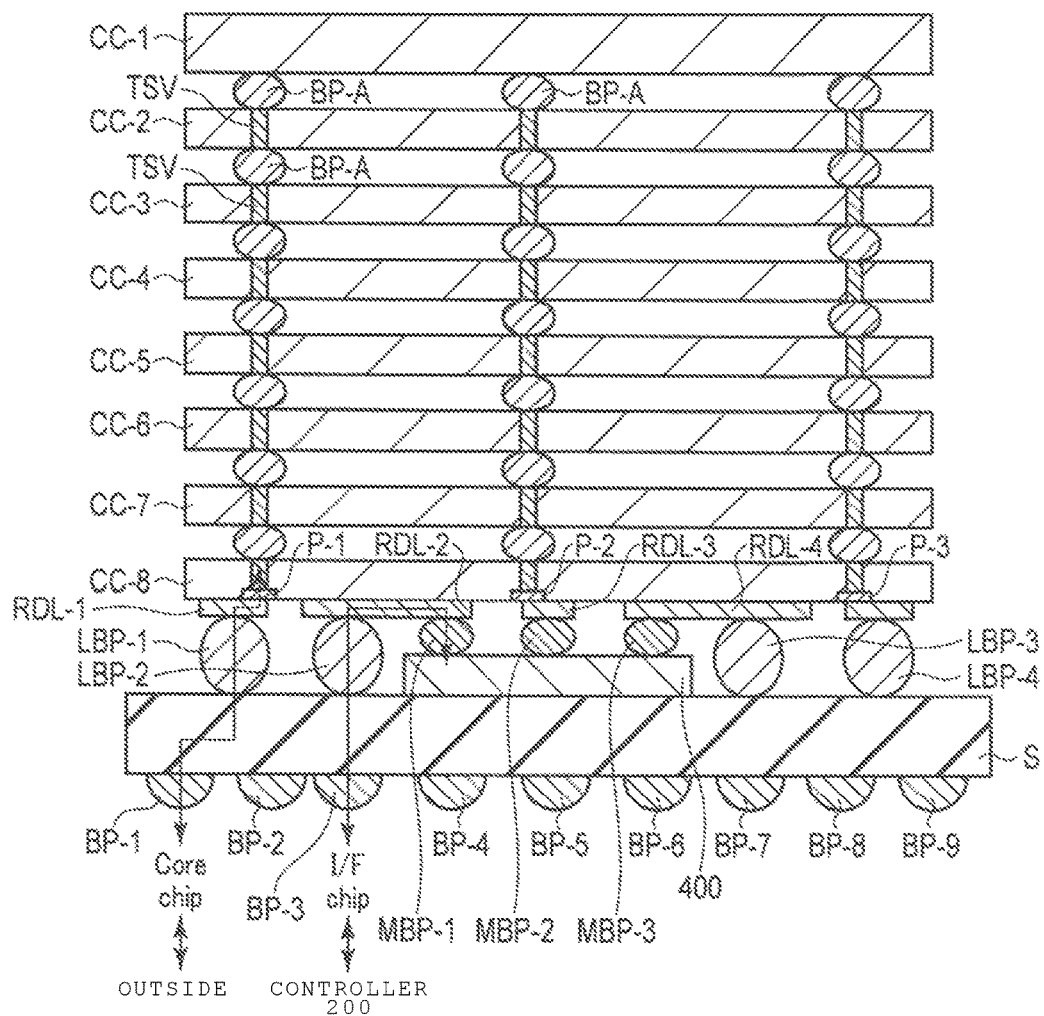
FIG. 6 is a cross-sectional view illustrating a chip stack including the I/F chip and NAND flash memory chips.

FIG. 6 is a cross-sectional view illustrating a mounting method of the I/F chip 400 and the NAND flash memory 100 according to the embodiment. While FIG. 1 illustrates the case where the memory system is provided with (N+1) NAND flash memories 100, FIG. 6 illustrates a semiconductor device having a two-channel configuration where one NAND flash memory 100 is mounted on each of eight core chips CC-1 to CC-8 (herein, N is 7).

As illustrated in FIG. 6, the I/F chip 400 is mounted on a mounting substrate S. A plurality of large bumps LBP (LBP-1 to LBP-4) are formed on a top of the semiconductor substrate S. In addition, a plurality of micro bumps MBP (MBP-1 to MBP-3) are formed on the top of the I/F chip 400. The large bumps LBP and the micro bumps MBP are formed to be at the same height with respect to the top of the substrate S, and the plurality of core chips CC (CC-1 to CC-8) are stacked thereon.

A plurality of bumps BP (BP-1 to BP-9) are formed on a bottom of the substrate S. The bump BP and the large bump LBP are electrically connected to each other via wirings formed in the substrate S. The bump BP is used to input/output signals to and from the outside of the substrate S. In the embodiment, for example, the bump BP-1 is used to supply a power source to each of the core chips CC-1 to CC-8. The bumps BP-2 to BP-9 are used to transmit the input/output signal I/O between the controller 200 and the I/F chip 400.

The plurality of core chips CC (CC-1 to CC-8) are stacked on the large bump LBP and the micro bump MBP. The core chips CC-1 to CC-8 are stacked using electrodes that are through-silicon vias (TSVs) penetrating the chips and bumps BP-A. Such a structure is called BGA (Ball Grid Array) and is one of package systems with many input/output pins.

In FIG. 6, although only the bumps BP1 to BP9, the large bumps LBP-1 to LBP-4, and the micro bumps MBP-1 to MBP-4 are illustrated, there are other bumps BP, large bumps LBP, and micro bumps MBP for input/output signals provided on the mounting substrate S, which are not illustrated.

In the example illustrated in FIG. 6, the core chips CC-2 to CC-8 are mounted in a face up manner on the mounting substrate, and the uppermost core chip CC-1 is mounted in a face down manner on the core chip CC-2. In each of the core chips CC (CC-1 to CC-8), the NAND flash memory 100 illustrated in FIG. 1 is formed. Alternatively, the core chips CC-2 to CC-8 may be mounted in a face down manner on the mounting substrate.

Rewiring layers RDL (RDL-1 to RDL-4 and a rewiring layer RDL (not illustrated)) are formed on the bottom (the side opposite to the top of the substrate S on which the NAND flash memory 100 is formed) of the lowermost core chip CC-8. The rewiring layer RDL is used to electrically connect the large bump LBP formed on the substrate S to the electrode TSV via the pad P. In addition, the rewiring layer RDL is used to electrically connect the large bump LBP formed on the substrate S to the micro bump MBP.

Specifically, the bump BP-1 is electrically connected to the TSV via the wiring formed in the substrate S, the large bump LBP-1, the rewiring layer RDL-1, and the pad P-1. The bumps BP-2 to the BP-9 and BPs (not illustrated) are electrically connected to the I/F chip 400 via the wirings formed in the substrate S, the large bumps LBP, the rewiring layers RDL, the micro bumps MBP, and the pads Pa (not illustrated). The I/F chip 400 is electrically connected to each of the core chips CC via the micro bumps MBP, the rewiring layers RDL, pads Pa', and the electrodes TSV.

The electrodes TSV are formed to penetrate through the core chips CC-2 to CC-8, respectively. The electrodes TSV formed in the core chips CC-2 to CC-8 are used to electrically connect the different upper and/or lower core chips CC to each other, respectively. Since the core chip CC-1 is mounted in a face down manner, the TSV is not formed therein. The NAND flash memory 100 formed in the core chip CC-1 is electrically connected to the electrode TSV of the core chip CC-2 via the bump BP-A and the pad (not illustrated). The electrodes TSV formed in the core chips CC-2 to CC-8 are respectively used such that the electrodes TSV of the different upper and/or lower core chips CC are electrically connected to each other via the bump BP-A.

1.2 Operation

A read operation relating to the channel 0 (ch0) of the I/F chip 400 according to the first embodiment will be described below with reference to timing charts illustrated in FIGS. 7A to 7E. The read operation relating to the channel 0 (ch0) will be described herein, but the same applies to an operation relating to the channel 1 (ch1).

The memory system according to the embodiment performs read and write operations on the NAND flash memory 100 by employing a double data rate (DDR) mode and using the signals DQS and BDQS.

In the case of the read operation, a data output command is input to the I/F chip 400 from the controller 200 with respect to the channel 0 (ch0), and then the corresponding NAND flash memory 100 is selected by a chip address signal. Specifically, the data output command and the chip address signal are transmitted to the large bump LBP mounted on the top of the substrate S via the bump BP mounted on the bottom of the substrate S and the wiring formed in the substrate S. Through the rewiring layer RDL mounted on the bottom of the core chip CC-8 and the micro bump MBP formed on the top of the I/F chip 400, the data output command and the chip address signal transmitted to the large bump LBP are supplied to the pads Pa and the input receivers IR of the I/O circuits 10-0 to 10-7 on the channel 0 (ch0) side, the data input latch DIN, and the corresponding micro bumps MBP of the micro bump regions A-1 and A-2. Thus, the corresponding NAND flash memory 100 is selected.

Next, the read enable signal REn is issued from the controller 200 with respect to the channel 0 (ch0). The signal REn is transmitted to the large bump LBP mounted on the top of the substrate S via the bump BP mounted on the bottom of the substrate S and the wiring formed in the substrate S. The signal REn transmitted to the large bump LBP reaches the pad Pa of the REn circuit 13 on the channel 0 (ch0) side through the rewiring layer RDL mounted on the bottom of the core chip CC-8 and the micro bump MBP mounted on the top of the I/F chip 400.

The signal REn reaching the pad Pa is supplied to the corresponding micro bump MBP formed in the micro bump regions A-1 and A-2, via the input receiver IR of the REn circuit 13, as an internal signal REn. The internal signal REn is transmitted to the NAND flash memory 100 selected by the address selection signal through the micro bumps MBP, the rewiring layers RDL, the pad P of the electrode TSV of the core chip CC-8, and the electrodes TSV and the bumps BP-A of the core chips CC-1 to CC-7 (FIG. 7A: CNT→I/F→NAND).

The signals (CEn, ALE, CLE, and WEn) other than the signals (I/O, DQS, BDQS, REn, and BREn) are transmitted and received between the controller 200 and the NAND flash memory 100 via the pads Pa and Pa' of the control circuits 21-1 to 21-4.

Figure 7:
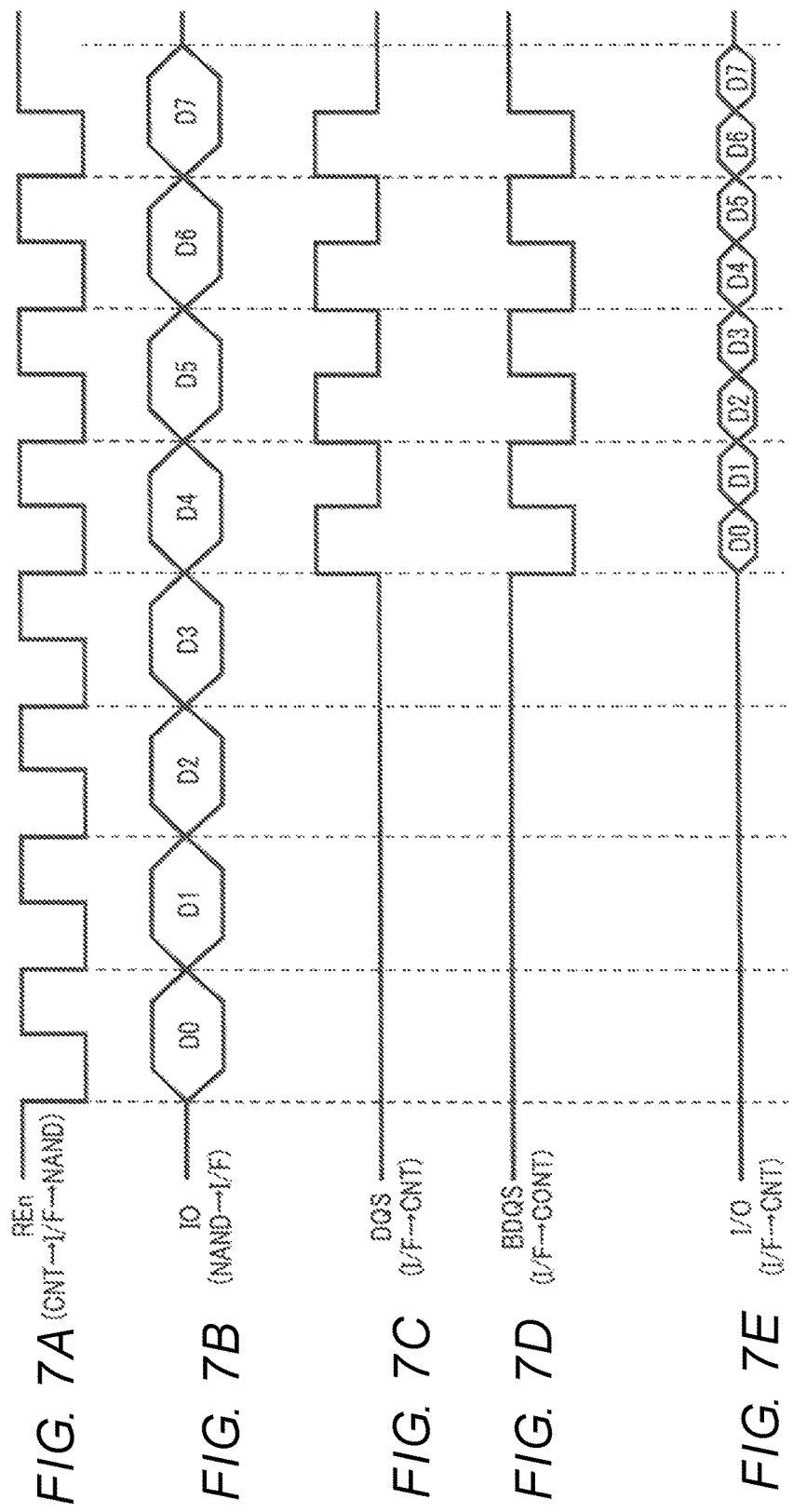
FIGS. 7A to 7E are diagrams illustrating a relationship between signals and data during data reading.

Upon receiving the signal REn, the NAND flash memory 100 corresponding to the channel 0 (ch0) reads the designated address data according to the falling edge of the signal REn (FIG. 7B: NAND→I/F). The read data passes through, as a signal I/O, the electrode TSV and the bumps BP-A of the core chips CC, the rewiring layer RDL of the core chip CC-8, and the corresponding micro bumps MBP in the micro bump regions A-1 and A-2 and is input to the MUX 620 of the I/O circuits 10-0 to 10-7 of the I/F chip 400 on the channel 0 (ch0) side via the pad Pa'.

The MUX 620 is provided in the I/O circuits 10-0 to 10-7 on the channel 0 (ch0) side and selects the corresponding read data stored in the buffer from the NAND flash memory 100.

The I/F chip 400 outputs the signals DQS and BDQS generated based on the signal REn, from the pad Pa of the DQS circuit 11 and the pad Pa of the BDQS circuit. In addition, the corresponding read data selected by the MUX 620 is output at a double data rate from the corresponding pad Pa of the I/O circuits 10-0 to 10-7 on the channel 0 (ch0) side, at a timing synchronized with the signals DQS and BDQS generated based on the signal REn in the I/F chip 400. The signals I/O, DQS, and BDQS output from the pad Pa are output to the controller 200 via the micro bumps MBP, the rewiring RDL, the large bumps LBP, the wirings formed in the substrate S, and the bumps BP (FIGS. 7C to 7E: I/F→CNT).

In the write operation, the signals I/O, DQS, and BDQS are output from the controller 200 with respect to the channel 0 (ch0). The signals I/O, DQS, and BDQS are transmitted to the large bump LBP mounted on the top of the substrate S via the bump BP mounted on the bottom of the substrate S and the wiring formed in the substrate S. The signals I/O, DQS, and BDQS transmitted to the large bump LBP reach the pads Pa of the I/O circuits 10-0 to 10-7, the DQS circuit 11, and the BDQS circuit 12 on the channel 0 (ch0) side, through the rewiring layer RDL mounted on the bottom of the core chip CC-8 and the micro bump MBP formed on the top of the I/F chip 400.

The signals I/O, DQS, and BDQS reaching the pads Pa are output to the corresponding micro bump MBP in the micro bump regions A-1 and A-2 via the input receivers IR of the I/O circuits 10-0 to 10-7, the DQS circuit 11, and the BDQS circuit 12 and the data input latch DIN. The signals I/O, DQS, and BDQS are transmitted to the NAND flash memory 100 selected by the address selection signal through the micro bump MBP, the rewiring layer RDL, the pad P of the electrode TSV of the core chip CC-8, and the electrodes TSV and the bumps BP-A of the core chips CC-1 to CC-7, and are written via the sense amplifier.

In the embodiment described above, although the number of pads Pa of the I/O circuits 10-0 to 10-7 is equally divided for each channel ch (I/O circuits 10-0 to 10-3 and I/O circuits 10-4 to 10-7), the number of pads may be differently divided.

In the embodiment, the I/F chip 400 has two-channel configuration, but the I/F chip 400 may have a single channel. In addition, the I/F chip 400 may have three or more channels.

1.3 Effects

1.3.1 Comparative Example

Figure 8:
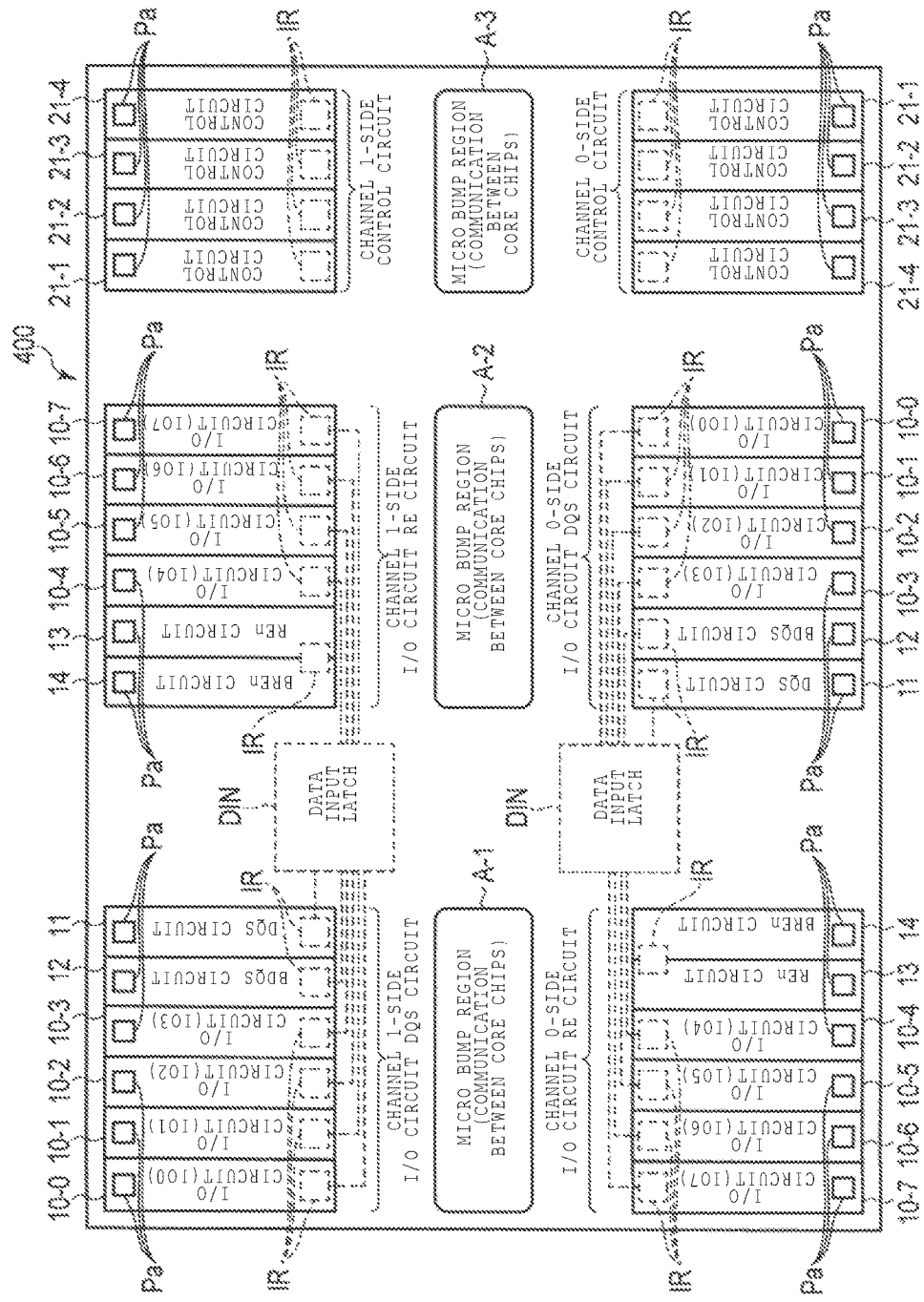
FIG. 8 is a diagram illustrating a layout configuration of pads on an I/F chip according to a comparative example.

FIG. 8 is a diagram illustrating a layout configuration of pads Pa of an I/F chip according to a comparative example.

A channel 0 (ch0)-side configuration will be described. As illustrated in FIG. 8, according to the layout of the pads Pa of the Comparative Example, the pads Pa of the I/O circuits 10-0 to 10-3, the BDQS circuit 12, and the DQS circuit 11 are aligned in a row on the channel 0 (ch0) side. In addition, the pads Pa of the I/O circuits 10-4 to 10-7, the REn circuit 13, and the BREn circuit 14 are aligned in a row. Further, the pads Pa of the control circuits 21-1 to 21-4 are aligned in a row. These three rows are aligned in the same direction.

The data input latch DIN is arranged in a region that is not between the row in which the pads Pa of the I/O circuits 10-0 to 10-3, the BDQS circuit 12, and the DQS circuit 11 are aligned and the row in which the pads Pa of the I/O circuits 10-4 to 10-7, the REn circuit 13, and the BREn circuit 14 are aligned.

In a case where the pads Pa are arranged in this manner, the I/O circuits 10-0 to 10-7 have the same configuration (in other words, the pads Pa have the same position in the respective I/O circuits 10-0 to 10-7), and the distance between the pad Pa and the input receiver IR is substantially the same in each of the I/O circuits 10-0 to 10-7. However, the distance between the input receiver IR of each of the I/O circuits 10-0 to 10-7 and the data input latch DIN affects the length of the input data line.

In the case of the layout of the pads Pa illustrated in FIG. 8, the input/output data lines extend to the pads Pa of the respective I/O circuits 10-0 to 10-7. Accordingly, the difference in the length of the input data line is largest between the distance to the pads Pa of the I/O circuits 10-0 and 10-7 which are furthermost from the data input latch DIN and the distance to the pads Pa of the I/O circuits 10-3 and 10-4 which are nearest to the data input latch DIN.

This leads to changes in waveforms and timing skew between the input and the output due to the difference in the length of the data line. In order to minimize the timing skew between the input and the output, the length of the data line to the other I/O circuits (10-1 to 10-6 in FIG. 8) is adjusted by extending them in accordance with the length of the data line to the I/O circuits (10-0 and 10-7 in FIG. 8) which are furthermost from the data input latch DIN. In this case, parasitic capacitance is increased by the extension of the data line, which leads to an increase in current consumption.

As for an output data line, since the signal I/O is output based on the common signal REn, the distance between the REn circuit 13 and the output circuit (for example, MUX 620) becomes a problem that the fluctuation in current consumption occurs. Accordingly, in the comparative example, the difference in the length of the output data line is largest between the nearest I/O circuit 10-4 and the furthermost I/O circuit 10-0.

1.3.2 Effects of First Embodiment

According to the I/F chip 400 of the semiconductor device according to the first embodiment, as illustrated in FIG. 3, the pads Pa of the I/O circuits 10-0 to 10-7 on the same channel are arranged to face each other in two rows. The data input latch DIN is provided between the facing pads Pa arranged in two rows. With such a configuration, the distance between each of the I/O circuits 10-0 to 10-7 and the data input latch DIN can be shortened as compared to the comparative example. Thus, timings of the signals I/O from the I/O circuits 10 are uniform, so that it is possible to prevent the extension of the data line of the other I/O circuits 10 (I/O circuits 10-1 to 10-6 in FIG. 8) in accordance with the length of the data line of the I/O circuits 10 (I/O circuits 10-0 and 10-7 in FIG. 8) furthermost from the data input latch DIN. As a result, the increase in current consumption can be minimized.

With such a configuration, it is possible to make the distance of an output clock signal supplied to the I/O circuits 10-0 to 10-7, the DQS circuit 11, and the BDQS circuit 12 uniform as compared to the comparative example. As a result, it is possible to prevent the skew of the output timing between the signal I/O and the signals DQS and BDQS. In order to minimize the skew of the output timing, the length of the output clock signal to the other circuits (I/O circuits 10-1 to 10-7, DQS circuit 11, and BDQS circuit 12) is adjusted sometimes by extending in accordance with the length of the output clock signal to the circuit (I/O circuit 10-0 in FIG. 8) which is furthermost from the REn circuit 13 and the BREn circuit 14. Even in such a case, the increase in parasitic capacitance can be prevented as compared to the comparative example, and thus the increase in current consumption can be minimized.

Accordingly, according to the first embodiment, the changes in waveforms and the timing skew between the input and the output due to the difference in the length of the plurality of input/output data lines can be prevented. Especially, even in a memory system operating at high speed, a timing margin can be improved. In addition, since the parasitic capacitance of the input/output data line is reduced, the power consumption can be reduced.

2. Second Embodiment

A memory system according to a second embodiment will be described below. The second embodiment and subsequent embodiments have the same configuration as the first embodiment except for the configuration of the I/F chip 400. In the following, differences from the first embodiment will be described.

Figure 9:
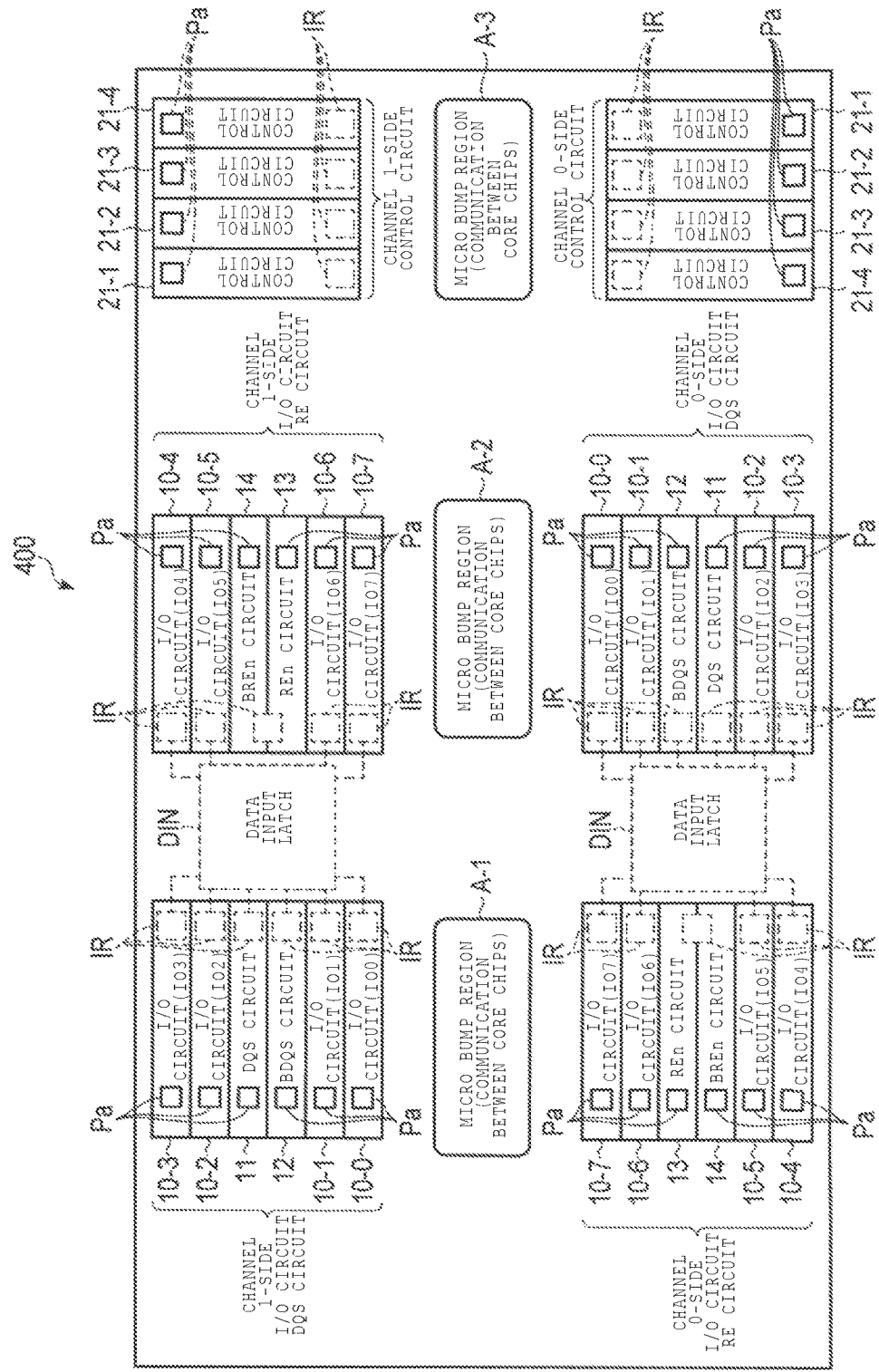
FIG. 9 is a diagram illustrating a layout configuration of pads on an I/F chip according to a second embodiment.

FIG. 9 is a diagram illustrating a layout configuration of pads Pa of an I/F chip 400 according to the second embodiment. As illustrated in FIG. 9, the layout of the I/O circuits 10-0 to 10-7, the DQS circuit 11, the BDQS circuit 12, the REn circuit 13, and the BREn circuit 14 is different from that in the first embodiment.

Specifically, the pads Pa of the I/O circuits 10-0 and 10-1, the BDQS circuit 12, the DQS circuit 11, and the I/O circuits 10-2 and 10-3 on the channel 0 (ch0) side are arranged from the inner side to the outer side of the I/F chip 400 in a row. Similarly, the pads Pa of the I/O circuits 10-7 and 10-6, the REn circuit 13, the BREn circuit 14, and I/O circuits 10-5 and 10-4 on the channel 0 (ch0) side are arranged in a row from the inner side to the outer sides of the I/F chip 400.

In the second embodiment, that is, the pads Pa of the BDQS circuit 12 and the DQS circuit 11 are arranged between the pads Pa of the I/O circuits 10-0 and 10-1 and the pads Pa of the I/O circuits 10-2 and 10-3. In addition, the pads Pa of the BREn circuit 14 and the REn circuit 13 are arranged between the pads Pa of the I/O circuits 10-4 and 10-5 and the pads Pa of the I/O circuits 10-6 and 10-7.

Next, the channel 1 (ch1)-side configuration will be described. The channel 1 (ch1)-side configuration is similar to, but is different in layout from the channel 0 (ch0)-side configuration described above. That is, the circuits on the channel 1 (ch1) side (e.g., I/O circuits 10-0 to 10-7, DQS circuit 11, BDQS circuit 12, REn circuit 13, and BREn circuit 14) are arranged to be point symmetric with respect to the center between the circuits on the channel 0 (ch0) side (e.g., I/O circuits 10-0 to 10-7, DQS circuit 11, BDQS circuit 12, REn circuit 13, and BREn circuit 14) and the circuits on the channel 1 (ch1) side (e.g., I/O circuits 10-0 to 10-7, DQS circuit 11, BDQS circuit 12, REn circuit 13, and BREn circuit 14).

According to the second embodiment, it is possible to make the wiring of an output clock signal generated from the input buffer of the REn circuit 13 and the BREn circuit 14 shorter in addition to the effects of the first embodiment.

3. Third Embodiment

Figure 10:
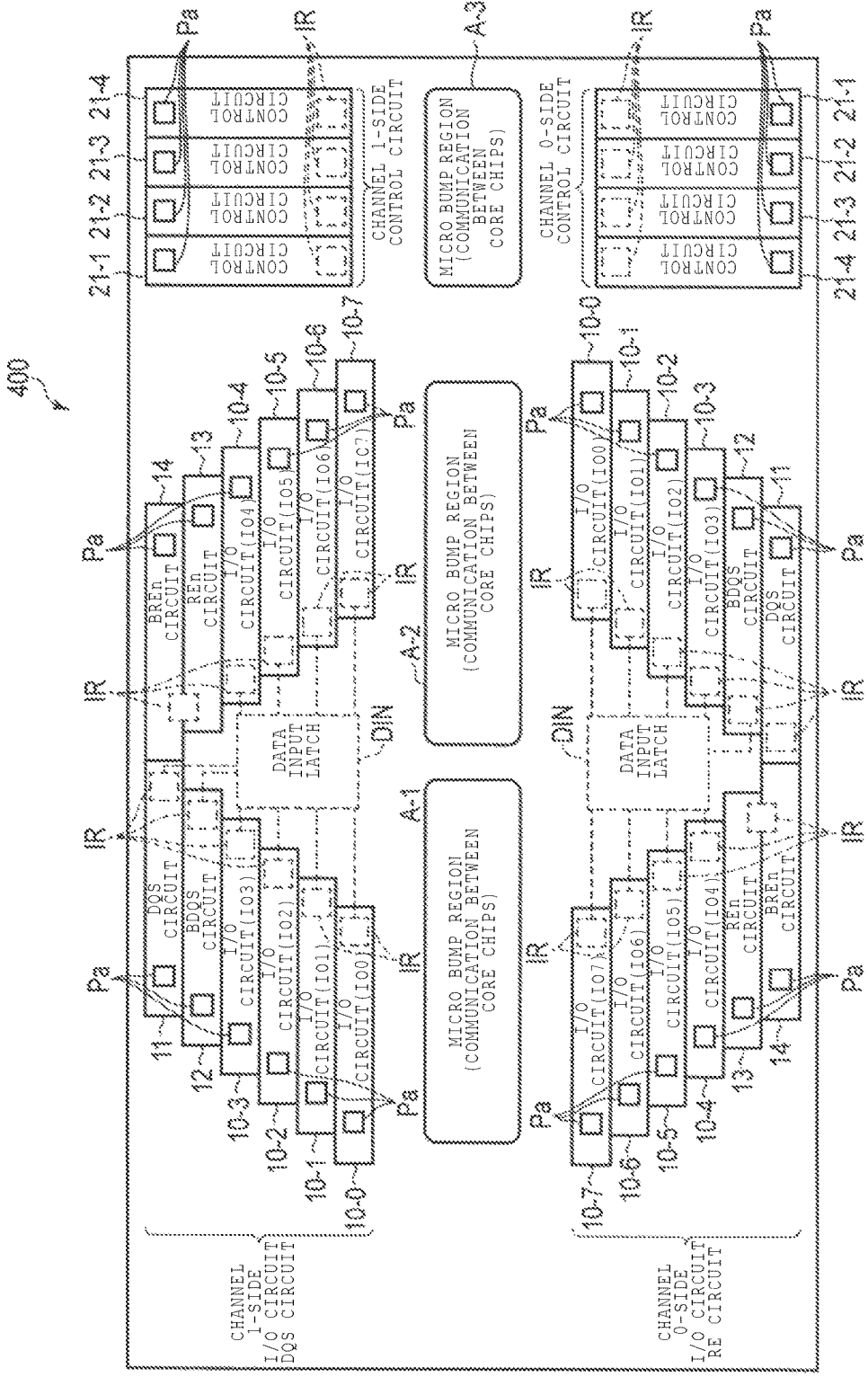
FIG. 10 is a diagram illustrating a layout configuration of pads on an I/F chip according to a third embodiment.

FIG. 10 is a diagram illustrating a layout configuration of pads Pa of an I/F chip 400 according to a third embodiment.

In the third embodiment, the pads Pa of the I/O circuits 10-0 to 10-3, the BDQS circuit 12, and the DQS circuit 11 on the channel 0 (ch0) side are diagonally arranged in a row from the inner side to the outer side of the I/F chip 400, as compared to the layout of the pad Pa of the I/O circuits 10-0 to 10-7, the BDQS circuit 12, the DQS circuit 11, the REn circuit 13, and the BREn circuit 14 in the first embodiment illustrated in FIG. 3. Similarly, the pads Pa of the I/O circuits 10-4 to 10-7, the REn circuit 13, and the BREn circuit 14 on the channel 0 (ch0) side are diagonally arranged in a row from the inner side to the outer side of the I/F chip 400.

The data input latch DIN is arranged between the row of the pads Pa of the I/O circuits 10-0 to 10-3 and the row of the pads Pa of the I/O circuits 10-4 to 10-7.

Next, a channel 1 (ch1)-side configuration will be described. The channel 1 (ch1)-side configuration is similar to, but is different in layout from the channel 0 (ch0)-side configuration described above. That is, the circuits on the channel 1 (ch1) side (e.g., I/O circuits 10-0 to 10-7, DQS circuit 11, BDQS circuit 12, REn circuit 13, and BREn circuit 14) are arranged to be point symmetric with respect to the center between the circuits on the channel 0 (ch0) side (e.g., I/O circuits 10-0 to 10-7, DQS circuit 11, BDQS circuit 12, REn circuit 13, and BREn circuit 14) and the circuits on the channel 1 (ch1) side (e.g., I/O circuits 10-0 to 10-7, DQS circuit 11, BDQS circuit 12, REn circuit 13, and BREn circuit 14).

According to the third embodiment, the evaluation for the I/F chip 400 unit is facilitated in addition to the effects of the first embodiment. That is, since there is no RDL wiring at the time of evaluation of the I/F chip 400 unit, it is necessary to connect to the pad of the I/F chip 400 with a wire. In the third embodiment, the pads Pa are diagonally arranged, and thus the wire can be implemented more easily.

4. Fourth Embodiment

Figure 11:
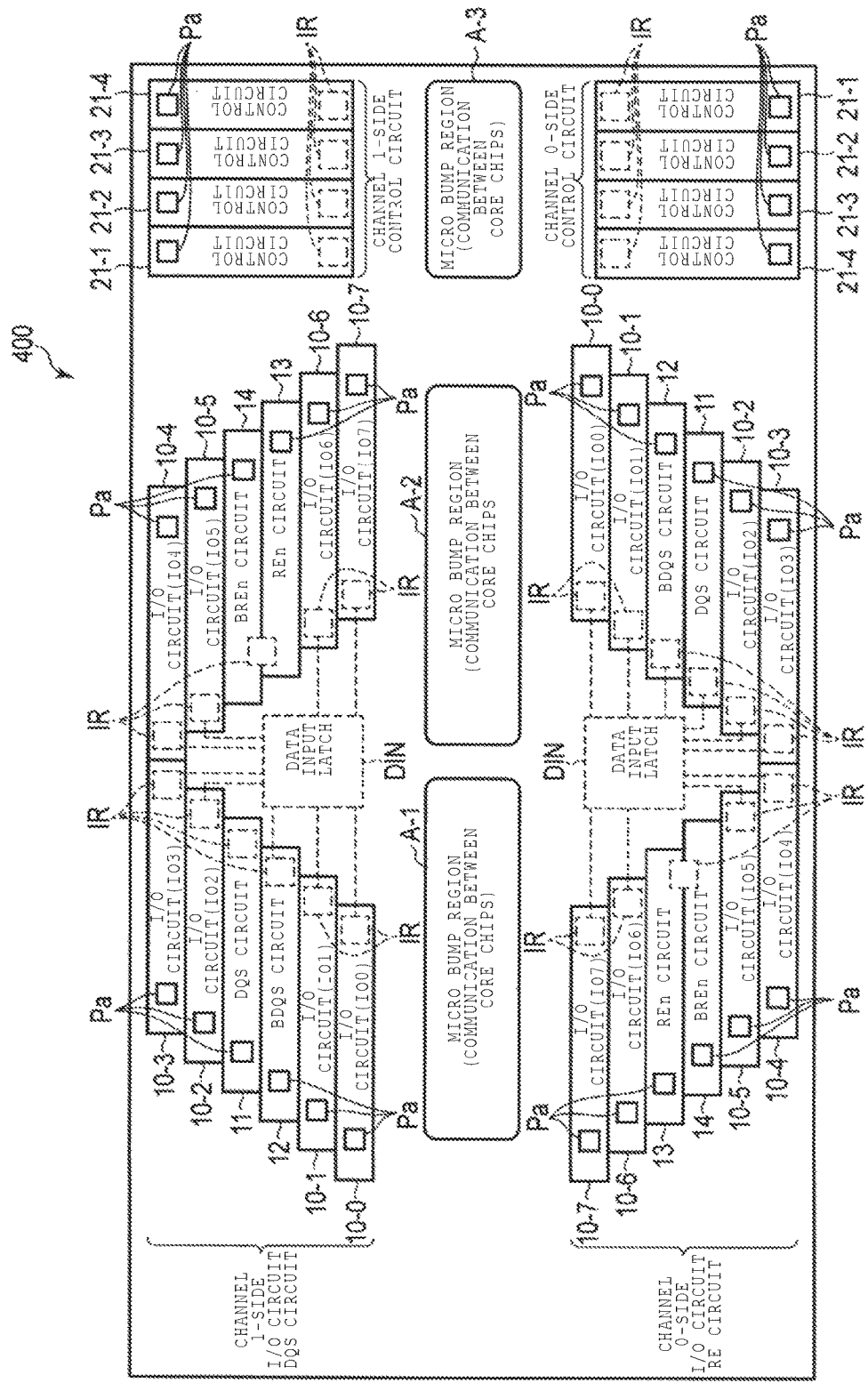
FIG. 11 is a diagram illustrating a layout configuration of pads on an I/F chip according to a fourth embodiment.

FIG. 11 is a diagram illustrating a layout configuration of pads Pa of an I/F chip 400 according to a fourth embodiment. As illustrated in FIG. 11, the layout of the I/O circuits 10-0 to 10-7, the DQS circuit 11, the BDQS circuit 12, the REn circuit 13, and the BREn circuit 14 is different from that in the first embodiment.

Specifically, the pads Pa of the I/O circuits 10-0 and 10-1, the BDQS circuit 12, the DQS circuit 11, and the I/O circuits 10-2 and 10-3 on the channel 0 (ch0) side are diagonally arranged in a row from the inner side to the outer side of the I/F chip 400. Similarly, the pads Pa of the I/O circuits 10-6 and 10-7, the REn circuit 13, the BREn circuit 14, and the I/O circuits 10-4 and 10-5 on the channel 0 (ch0) side are diagonally arranged in a row from the inner side to the outer side of the I/F chip 400.

That is, in the fourth embodiment, the pads Pa of the BDQS circuit 12 and the DQS circuit 11 are arranged between the pads Pa of the I/O circuits 10-0 and 10-1 and the pads Pa of the I/O circuits 10-2 and 10-3. In addition, the pads Pa of the BREn circuit 14 and the REn circuit 13 are arranged between the pads Pa of the I/O circuits 10-4 and 10-5 and the pads Pa of the I/O circuits 10-6 and 10-7.

Next, the channel 1 (ch1)-side configuration will be described. The channel 1 (ch1)-side configuration is similar to, but is different in layout from the channel 0 (ch0)-side configuration described above. That is, the circuits on the channel 1 (ch1) side (e.g., I/O circuits 10-0 to 10-7, DQS circuit 11, BDQS circuit 12, REn circuit 13, and BREn circuit 14) are arranged to be point symmetric with respect to the center between the circuits on the channel 0 (ch0) side (e.g., I/O circuits 10-0 to 10-7, DQS circuit 11, BDQS circuit 12, REn circuit 13, and BREn circuit 14) and the circuits on the channel 1 (ch1) side (e.g., I/O circuits 10-0 to 10-7, DQS circuit 11, BDQS circuit 12, REn circuit 13, and BREn circuit 14).

According to the fourth embodiment, it is possible to make the wiring of an output clock signal generated from the input buffer of the REn circuit 13 and the BREn circuit 14 shorter in addition to the effects of the third embodiment.

5. Fifth Embodiment

Figure 12:
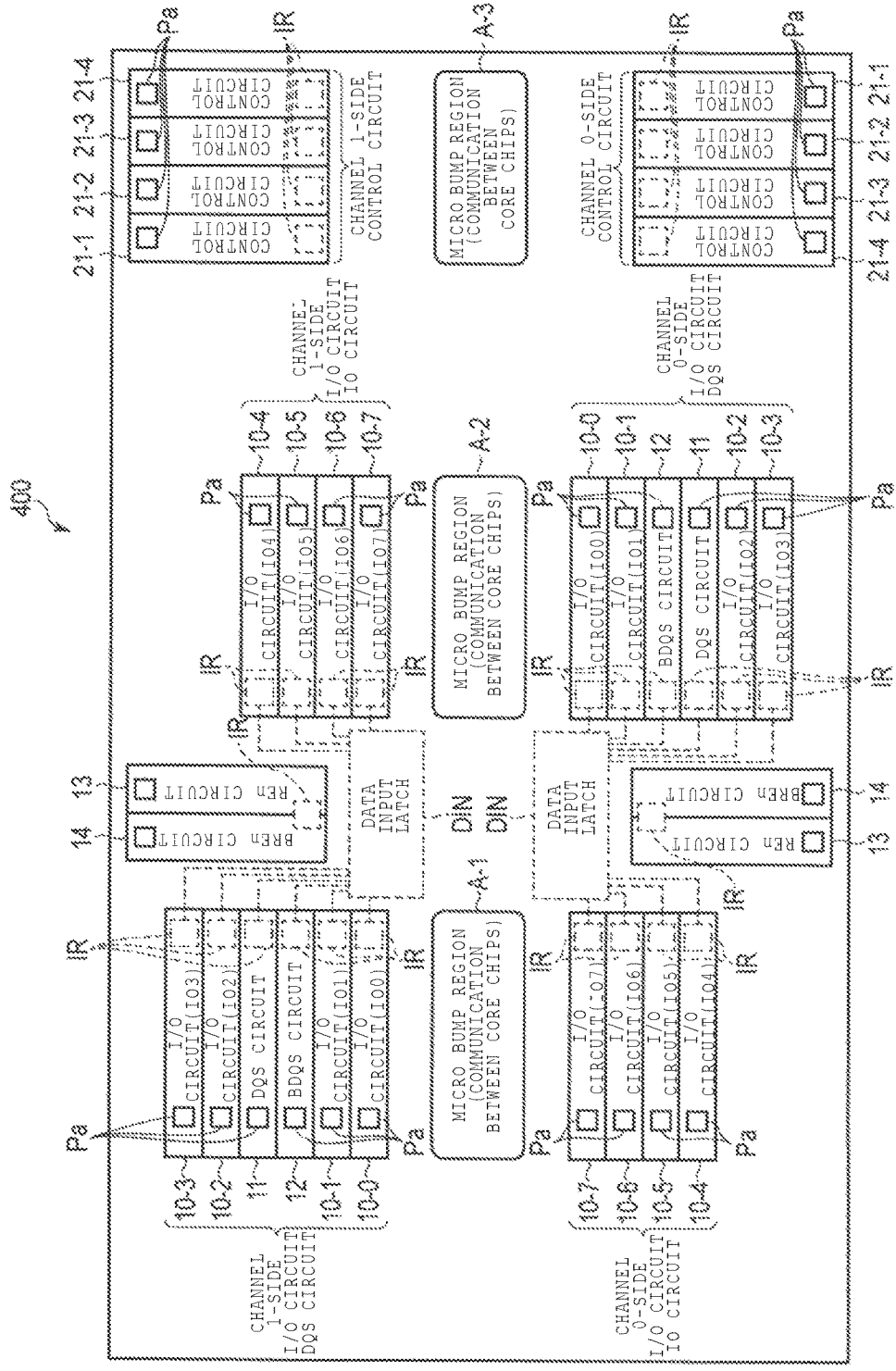
FIG. 12 is a diagram illustrating a layout configuration of pads on an I/F chip according to a fifth embodiment.

FIG. 12 is a diagram illustrating a layout configuration of pads Pa of an I/F chip 400 according to a fifth embodiment. FIG. 12 illustrates the layout configuration of the I/F chip 400 having a two-channel configuration.

A channel 0 (ch0)-side configuration will be described. The row of the pads Pa of the control circuits 21-1 to 21-4, the I/O circuits 10-0 to 10-3, the DQS circuit 11, and the BDQS circuit 12 are arranged in the same manner as the second embodiment illustrated in FIG. 9. The pads Pa of the I/O circuits 10-4 to 10-7 are arranged in a row from the inner side to the outer side of the I/F chip 400.

The row of the pads Pa of the REn circuit 13 and the BREn circuit 14 is arranged in a direction orthogonal to the row of the pads Pa of the I/O circuits 10-0 to 10-3, the DQS circuit 11, and the BDQS circuit 12 and the row of the pads Pa of the I/O circuits 10-4 to 10-7.

Further, the data input latch DIN is arranged between the row of the pads Pa of the I/O circuits 10-0 to 10-3, the DQS circuit 11, and the BDQS circuit 12 and the row of the pads Pa of the I/O circuits 10-4 to 10-7.

Next, a channel 1 (ch1)-side configuration will be described. The channel 1 (ch1)-side configuration is similar to, but is different in layout from the channel 0 (ch0)-side configuration described above. That is, the circuits on the channel 1 (ch1) side (e.g., I/O circuits 10-0 to 10-7, DQS circuit 11, BDQS circuit 12, REn circuit 13, and BREn circuit 14) are arranged to be point symmetric with respect to the center between the circuits on the channel 0 (ch0) side (e.g., I/O circuits 10-0 to 10-7, DQS circuit 11, BDQS circuit 12, REn circuit 13, and BREn circuit 14) and the circuits on the channel 1 (ch1) side (e.g., I/O circuits 10-0 to 10-7, DQS circuit 11, BDQS circuit 12, REn circuit 13, and BREn circuit 14).

According to the fifth embodiment, it is possible to make the wiring of an output clock signal generated from the input buffer of the REn circuit 13 and the BREn circuit 14 shorter in addition to the effects of the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
a plurality of first input/output circuits for a first channel;
a plurality of first input/output pads respectively corresponding to the plurality of first input/output circuits and aligned with each other along a first direction;
a plurality of second input/output circuits for the first channel;

a plurality of second input/output pads respectively corresponding to the plurality of second input/output circuits and aligned with each other along a second direction;

a data input latch circuit positioned between the plurality of first input/output pads and the plurality of second input/output pads, wherein a straight line extending from one of the first input/output pads to one of the second input/output pads intersects each of the first and second directions and crosses the position of the data input latch circuit;

a first non-input/output circuit and a pad corresponding thereto that is aligned with the first input/output pads in the first direction; and a second non-input/output circuit and a pad corresponding thereto that is aligned with the second input/output pads in the second direction, wherein the first direction and the second direction are parallel, the pad corresponding to the first non-input/output circuit is between at least two of the first input/output pads, and the pad corresponding to the second non-input/output circuit is between at least two of the second input/output pads.

2. The semiconductor device according to claim 1, wherein the second non-input/output circuit is a read enable circuit.

3. A semiconductor device for transmitting and receiving a signal to and from a memory device, the semiconductor device comprising:

a plurality of first input/output circuits, each respectively having a first input/output pad for a first channel of the memory device arranged in a first row;

a plurality of second input/output circuits, each respectively having a second input/output pad for the first channel of the memory device arranged in a second row spaced from the first row in a first direction;

an input circuit positioned between the first and second rows in the first direction, the input circuit connected to the memory device and configured to input data received through the first and second input/output pads to the memory device, wherein at least two of the first input/output pads are at a first distance from the input circuit along the first direction and at least two of the second input/output pads are at the first distance from the input circuit along the first direction;

a first non-input/output circuit and a pad corresponding thereto that is aligned with the first input/output pads in the first row; and a second non-input/output circuit and a pad corresponding thereto that is aligned with the second input/output pads in the second row, wherein the first row and the second row extend in parallel, the pad corresponding to the first non-input/output circuit is between at least two of the first input/output pads, and the pad corresponding to the second non-input/output circuit is between at least two of the second input/output pads.

4. The semiconductor device according to claim 3, wherein the second non-input/output circuit is a read enable circuit.

5. A semiconductor device comprising:

a plurality of memory chips, each including a substrate and electrodes penetrating the substrate and formed with memory devices connected to the electrodes; and an interface chip configured to transmit and receive data to and from the plurality of memory devices via the electrodes of the memory chips, wherein the plurality of memory chips includes a first memory chip stacked on the interface chip and a second memory chip stacked on the first memory chip, and the interface chip includes:

a plurality of first input/output pads that are associated with a first channel provided between the first input/output pads and the memory chips and arranged in a first row;

a plurality of second input/output pads that are associated with the first channel and arranged in a second row; and an input circuit between the first and second rows and connected to the memory chips to which the input circuit performs input of data received through the first and second input/output pads, wherein at least two of the first input/output pads are spaced from the input circuit by substantially the same distance and at least two of the second input/output pads are spaced from the input circuit by substantially the same distance.

6. The semiconductor device according to claim 5, wherein the first row and the second row extend in parallel.

7. The semiconductor device according to claim 6, further comprising:

a first non-input/output circuit and a pad corresponding thereto that is aligned with the first input/output pads in the first row; and a second non-input/output circuit and a pad corresponding thereto that is aligned with the second input/output pads in the second row, wherein the pad corresponding to the first non-input/output circuit is between at least two of the first input/output pads, and the pad corresponding to the second non-input/output circuit is between at least two of the second input/output pads.

8. The semiconductor device according to claim 6, further comprising:

a first non-input/output circuit and a pad corresponding thereto that is aligned with the first input/output pads in the first row, wherein the pad corresponding to the first non-input/output circuit is between at least two of the first input/output pads; and a second non-input/output circuit and a pad corresponding thereto that is between the first input/output pads and the second input/output pads.

9. The semiconductor device according to claim 5, wherein the first row extends in a first direction and the second row extends in a second direction that crosses the first direction.

10. The semiconductor device according to claim 9, further comprising:

a first non-input/output circuit and a pad corresponding thereto that is aligned with the first input/output pads in the first row; and a second non-input/output circuit and a pad corresponding thereto that is aligned with the second input/output pads in the second row, wherein the pad corresponding to the first non-input/output circuit is between at least two of the first input/output pads, and the pad corresponding to the second non-input/output circuit is between at least two of the second input/output pads.

* * * * *